United States Patent
Ormsbee et al.

(10) Patent No.: US 11,248,777 B2
(45) Date of Patent: Feb. 15, 2022

(54) SYSTEMS AND METHODS FOR A RECHARGEABLE LIGHTING MODULE AND ASSOCIATED CARRIER

(71) Applicant: Nite Ize, Inc., Boulder, CO (US)

(72) Inventors: Bowden Ormsbee, Longmont, CO (US); Steven L. Lindquist, Broomfield, CO (US)

(73) Assignee: Nite Ize, Inc., Boulder, CO (US)

( * ) Notice: Subject to any disclaimer, the term of this patent is extended or adjusted under 35 U.S.C. 154(b) by 173 days.

(21) Appl. No.: 16/206,817

(22) Filed: Nov. 30, 2018

(65) Prior Publication Data
US 2020/0173637 A1 Jun. 4, 2020

(51) Int. Cl.
| | |
|---|---|
| B62J 6/00 | (2020.01) |
| F21V 21/08 | (2006.01) |
| F21V 15/01 | (2006.01) |
| F21V 23/04 | (2006.01) |
| F21V 23/02 | (2006.01) |
| H05K 1/18 | (2006.01) |
| F21S 43/19 | (2018.01) |
| F21S 43/14 | (2018.01) |
| F21W 103/10 | (2018.01) |
| F21S 45/50 | (2018.01) |

(Continued)

(52) U.S. Cl.
CPC .............. *F21V 21/08* (2013.01); *F21S 43/14* (2018.01); *F21S 43/19* (2018.01); *F21V 15/01* (2013.01); *F21V 23/02* (2013.01); *F21V 23/04* (2013.01); *H05K 1/181* (2013.01); *F21S 45/50* (2018.01); *F21W 2103/10* (2018.01); *F21W 2107/13* (2018.01); *F21Y 2115/10* (2016.08); *H05K 2201/10106* (2013.01)

(58) Field of Classification Search
CPC .......... F21V 21/08; F21V 15/01; F21V 23/04; F21V 23/007; F21V 23/023; F21V 23/06; F21V 15/015; F21V 15/012; F21V 15/04; F21V 15/02; F21V 31/005; F21S 9/02; F21W 2107/13; F21L 4/04
See application file for complete search history.

(56) References Cited

U.S. PATENT DOCUMENTS

| | | | |
|---|---|---|---|
| 5,283,547 A * | 2/1994 | Leon .......................... | B62J 6/20 340/432 |
| 9,113,504 B1 | 8/2015 | Hamasaki | |

(Continued)

OTHER PUBLICATIONS

International Search Report and Written Opinion dated Feb. 3, 2020 issued in related PCT App. No. PCT/US2019/063791 (8 pages).

*Primary Examiner* — Omar Rojas Cadima
(74) *Attorney, Agent, or Firm* — Haynes and Boone, LLP

(57) ABSTRACT

A lighting device includes a lighting module. The lighting module includes a module frame and a circuit board interconnected with the module frame. The lighting module further includes a button mounted on the module frame and interconnected with the circuit board, the button located in a recess of the module frame, such that the button is actuatable by a protrusion of a device into which the lighting module is inserted. The lighting device includes a device body, the device body including a second recess for receiving the lighting module. The lighting device further includes a cap, the cap formed to fit with the device body and close the second recess when the lighting module is in the second recess.

24 Claims, 15 Drawing Sheets

(51) Int. Cl.
  *F21Y 115/10* (2016.01)
  *F21W 107/13* (2018.01)

(56) References Cited

U.S. PATENT DOCUMENTS

| | | |
|---|---|---|
| 2004/0201983 A1* | 10/2004 | Yu .................. F21V 33/0004 |
| | | 362/157 |
| 2008/0298048 A1 | 12/2008 | Garrity et al. |
| 2015/0016097 A1* | 1/2015 | Marztall |
| 2015/0189963 A1* | 7/2015 | Lai et al. |
| 2015/0270734 A1* | 11/2015 | Davison et al. |
| 2017/0184260 A1* | 6/2017 | Munoz Abogabir ... F21V 23/04 |
| 2017/0232307 A1 | 8/2017 | Weilong |
| 2018/0031188 A1 | 2/2018 | Sharrah et al. |
| 2018/0249134 A1* | 8/2018 | Siminoff ................ H04N 7/188 |

\* cited by examiner

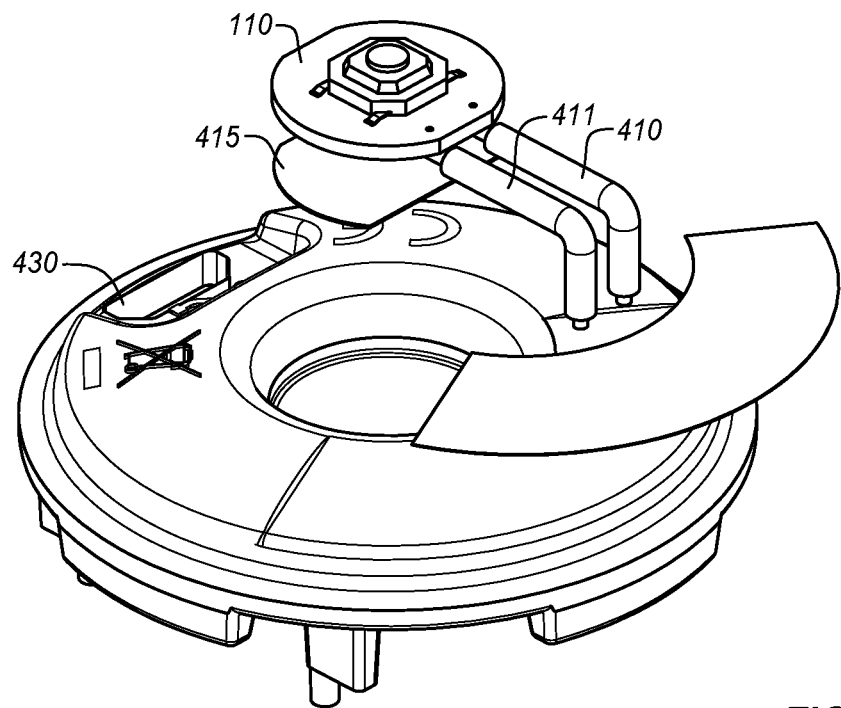
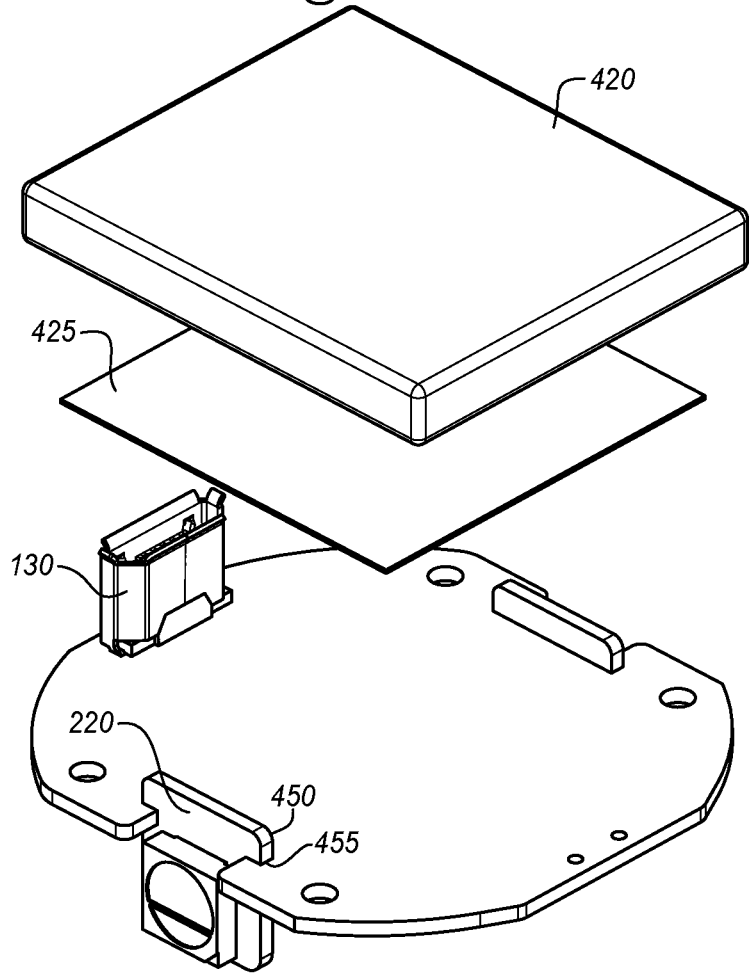
FIG. 4

*FIG. 24*           *FIG. 25*
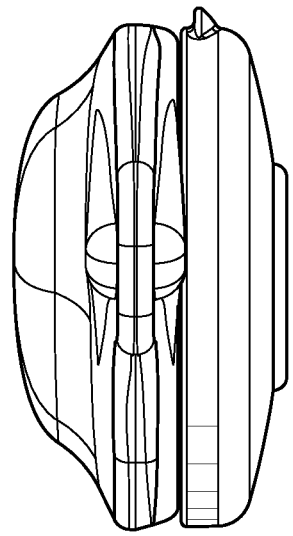
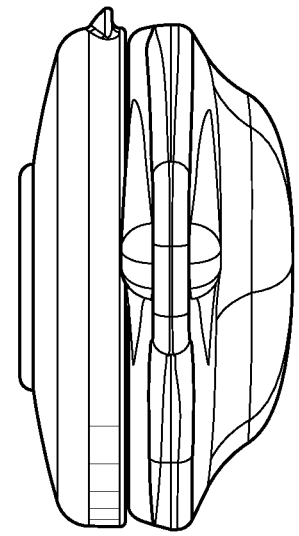
*FIG. 26*
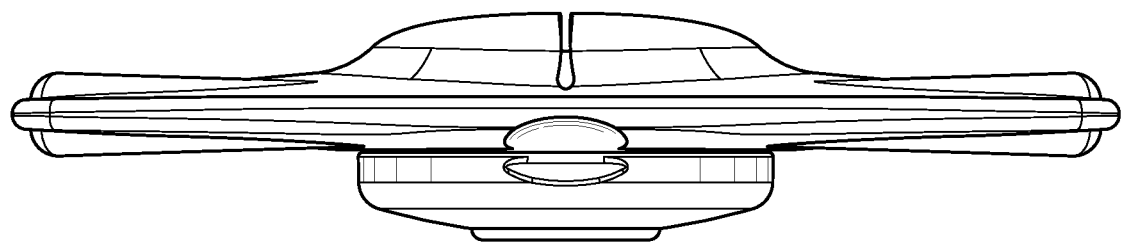
*FIG. 27*
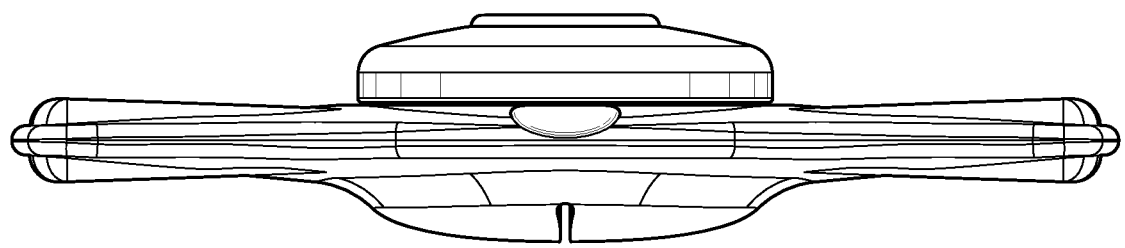

SYSTEMS AND METHODS FOR A RECHARGEABLE LIGHTING MODULE AND ASSOCIATED CARRIER

BACKGROUND

Lighting devices for personal usage are desirable for users. Lighting devices that are wearable and attachable to coats, dog collars, bags and other objects are commonly utilized by users. These lighting devices may serve the purpose of visibility and safety as well as fun and many other purposes. Additionally, they may be modified for ready attachment to a variety of vehicles or structures.

BRIEF SUMMARY

In one embodiment, a lighting module includes a module frame and a circuit board interconnected with the module frame. The lighting module further includes a button mounted on the module frame and interconnected with the circuit board, the button located in a recess of the module frame, such that the button is actuatable by a protrusion of a device into which the lighting module is inserted. In one alternative, the frame and the circuit board sandwich a battery. In one alternative, a charging port, wherein the battery is rechargeable, and the module frame includes an aperture for the charging port. In another alternative, the frame includes a ledge for interfacing with a lip of the recess of the module frame to prevent the removal of the lighting module from the recess. In another alternative, the frame protects a face of the lighting module, the face being exposed when the lighting module is in the recess. Optionally, a LED is mounted on the circuit board. In another alternative, the LED is mounted normal to the circuit board.

In one embodiment, a lighting device includes a lighting module. The lighting module includes a module frame and a circuit board interconnected with the module frame. The lighting module further includes a button mounted on the module frame and interconnected with the circuit board, the button located in a recess of the module frame, such that the button is actuatable by a protrusion of a device into which the lighting module is inserted. The lighting device includes a device body, the device body including a second recess for receiving the lighting module. The lighting device further includes a cap, the cap formed to fit with the device body and close the second recess when the lighting module is in the second recess. In one alternative, the second recess includes a lip that interfaces with a ledge of the module frame, preventing the lighting module from being removed from the second recess. In another alternative, the lighting module includes an LED and the device body is shaped such that a portion of the device body is in close proximity to the LED. Optionally, the lighting module includes an LED and the device body is shaped such that a portion of the device body is in contact with the LED to the LED. Alternatively, device body includes an aperture shaped to receive the LED. In another alternative, the device body includes a protrusion that is adjacent to the LED when the lighting module is inserted in the second recess. Optionally, the LED is oriented to project light primarily along a major axis of the device. Alternatively, an arm extends from the device body along the major axis of the device. Optionally, the aperture positions the LED to project light primarily into the arm. Alternatively, the cap includes a button area and a raised portion surrounding the button area, the raised portion preventing the button from being inadvertently activated. In one configuration, a first underside portion opposite the raised portion interfaces with a raised portion of the module frame that surrounds the first recess, such that the raised portion cannot be depressed. In another configuration, a second underside portion opposite the button area interfaces with the button, such that when the button area is depressed the button is pushed. Optionally, the button is a momentary switch. In one alternative, the device body includes a carabiner portion. In another alternative, the device body includes an aperture for attachment to a spoke and a first and second arm for bracing against a spoke. Optionally, the first and second arm each include a protrusion for bracing against the spoke.

In one embodiment, a method of using a lighting device includes providing a lighting device. The lighting device includes a lighting module. The lighting module includes a module frame and a circuit board interconnected with the module frame. The lighting module further includes a button mounted on the module frame and interconnected with the circuit board, the button located in a recess of the module frame, such that the button is actuatable by a protrusion of a device into which the lighting module is inserted. The lighting device includes a device body, the device body including a second recess for receiving the lighting module. The lighting device further includes a cap, the cap formed to fit with the device body and close the second recess when the lighting module is in the second recess. The method further includes pressing on the raised area of the button and not activating the lighting device. The method further includes pressing on the button area and activating the lighting device.

BRIEF DESCRIPTION OF THE DRAWINGS

FIG. 4 shows an exploded view of the rechargeable lighting device of FIG. 1;

FIGS. 20-27 show additional views of spoke mounted lighting device of FIG. 5.

DETAILED DESCRIPTION

Certain terminology is used herein for convenience only and is not to be taken as a limitation on the embodiments of the systems and methods for rechargeable lighting modules. In many embodiments, a rechargeable lighting module includes an LED light source. The rechargeable lighting module includes a rechargeable battery. The rechargeable lighting module includes circuitry for driving the LED light source. The rechargeable lighting module includes a single button for activation and mode selection. The rechargeable lighting module includes a circuit board, typically printed, for holding the circuitry. The circuit board is integrated with a module frame (also called a module cap). The module frame assists in holding the device together by sandwiching the rechargeable battery between it and the circuit board. The module frame accommodates access to the single button and sets the single button low, such that it may not easily be accidentally actuated. In many embodiments, the circuit board includes a recharging port. The module frame has a cutout to accommodate the recharging port. In some alternatives, the LED light source is mounted centrally in the circuit board. In other alternatives, the LED light source may be mounted perpendicularly to the main portion of the circuit board. In many embodiments, the module frame includes a lip that interfaces with a lip of a mounting device. In many embodiments, the mounting device includes a corresponding lip for interfacing with the lip of the module frame.

Figure 1:
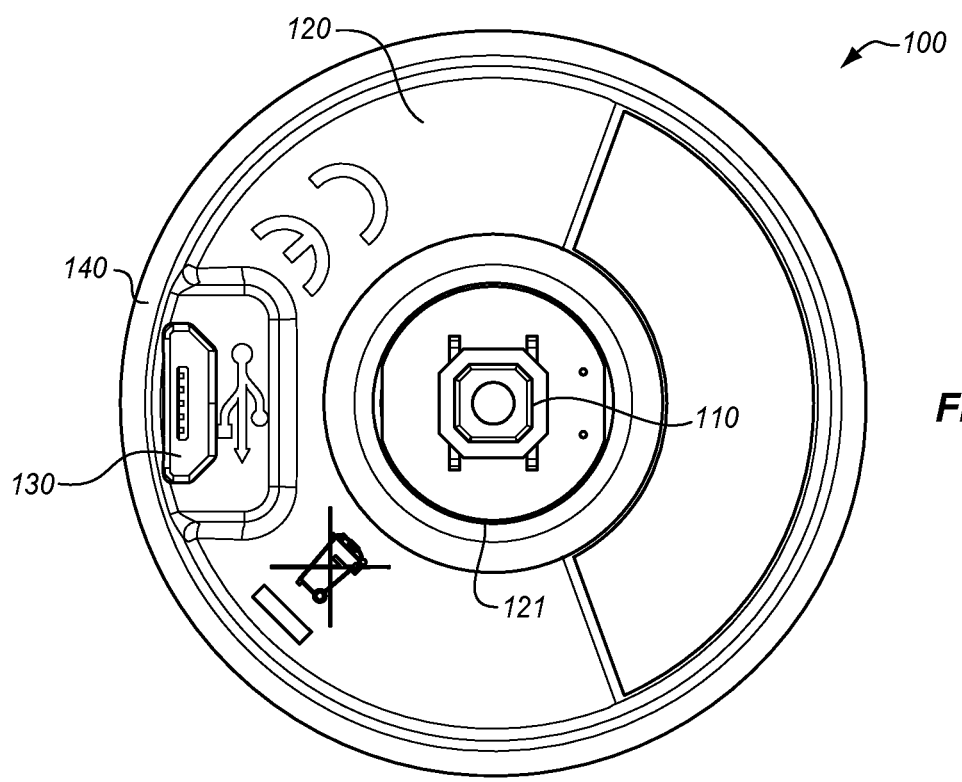
FIG. 1 shows a top view of one embodiment of a rechargeable lighting module.

FIG. 1 shows a top view of one embodiment of a rechargeable lighting module 100. Visible in this switch 110. Switch 11 is mounted on rechargeable lighting module 100 and provides for activation and deactivation of the device. Switch 110 is mounted on module frame 120. In many configurations, switch 110 is a PCB circuit assembly. In many embodiments, a small, durable single button switch is used. In some alternatives, multiple switches are mounted on module frame 120, however, this may add to the complexity of the device and the holder. A momentary switch is typically desirable for may configurations of switch 110, since when the rechargeable lighting module 100 is mounted in a holder and completely enclosed the device may still be activated if the holder provides flexibility. Module frame 120 generally protects the underlying circuitry and provides for a structure for the device. Notably, module frame 120 also includes a depression 121 where switch 110 is mounted. This depression 121 protects the switch 110 and when the device in integrated into a holder, may prevent the activation of the device in some configurations. Additionally, rechargeable lighting module 100 includes a charging port 130. In many embodiments, charging port 130 is a micro USB port. Alternatively, charging port 130 may be any type of charging port, through which a connected wire can provide a charge. Additionally, module frame 120 includes a lip 140 that may interface with a lip of a holder to prevent the removal of rechargeable lighting module 100 after insertion.

Figure 2:
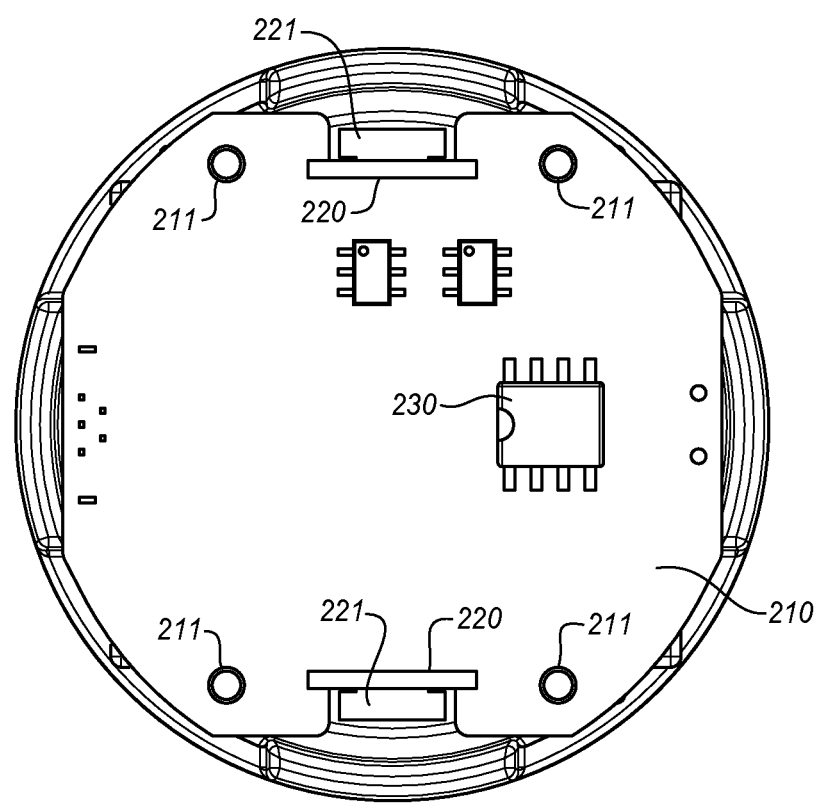
FIG. 2 shows a bottom view of the rechargeable lighting device of FIG. 1.

FIG. 2 shows a bottom view of the rechargeable lighting device of FIG. 1. In this view, a circuit board 210 is visible. Circuit board 210 is attached to module frame 120 creating an enclosure for the battery inside. In many embodiments, it may be heat staked at attachment points 211. Circuit board 210 is typically a printed circuit board. Additionally, perpendicular circuit board 220 and LED 221 are visible in this view. LED 221 is oriented to project light generally away from rechargeable lighting module 100 in a radial fashion. In the embodiment shown, two perpendicular circuit board 220 and LED 221 are shown, however, one, two, or more may be included. Additionally, as shown in addition embodiments, the position of the LED may be changed completely. The circuit board 210 may include various circuit modules 230, and typically includes a microprocessor type for driving the LEDs.

Figure 3:
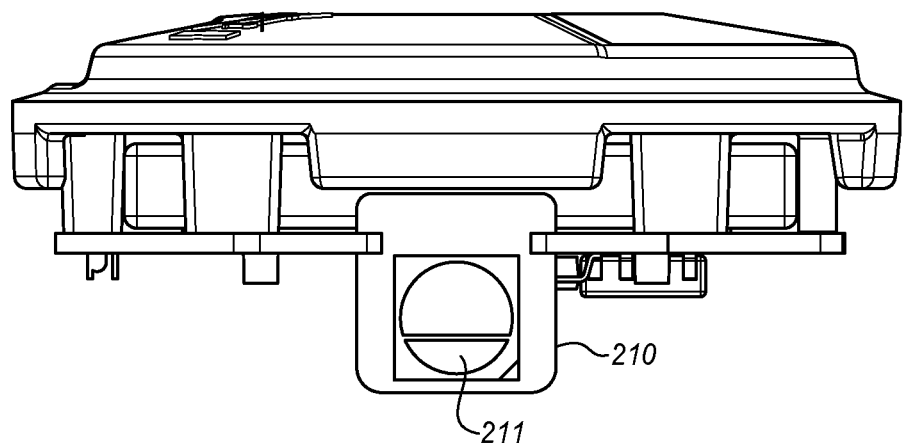
FIG. 3 shows a side view of the rechargeable lighting device of FIG. 1.

FIG. 3 shows a side view of the rechargeable lighting device of FIG. 1. In this view perpendicular circuit board 210 and LED 211 are visible.

FIG. 4 shows an exploded view of the rechargeable lighting device of FIG. 1. In this view switch 110 is visible as well as wires 410, 411 that provide for connection of the switch to the circuit board 210. Typically, an adhesive 415 is provided to attach switch 110 to module frame 120. This adhesive may be in the form of tape. Battery 420 is show in this figure as is charging port 130. Typically, an adhesive 425 is provided to attach battery 420 to circuit board 210. This adhesive may be in the form of tape. Modular frame 120 includes an aperture 430 for charging port 130. In this view, circuit board 220 is shown interfaced with circuit board 210. In the embodiment shown, notch 450 interfaces with aperture 455 in circuit board 210.

Therefore, a compact, complete, and easily insertable module is provided. Rechargeable lighting module 100 is therefore, in many embodiments, a one-piece lighting module, easily insertable into a device. After insertion, only the modular frame 120, charging port 130, and switch 110 may be accessible. Therefore, the more delicate circuit board is protected. In many embodiments, rechargeable lighting module 100 fits into a two-part shell. When closed, the shell is waterproof and/or sealed. When one side of the shell is opened, the rechargeable lighting module 100 may continue to sit in one half of the shell, with the face of the modular frame 120 exposed. In many embodiments, the shell may be translucent in order to capture and diffuse light from the LED.

Figure 5:
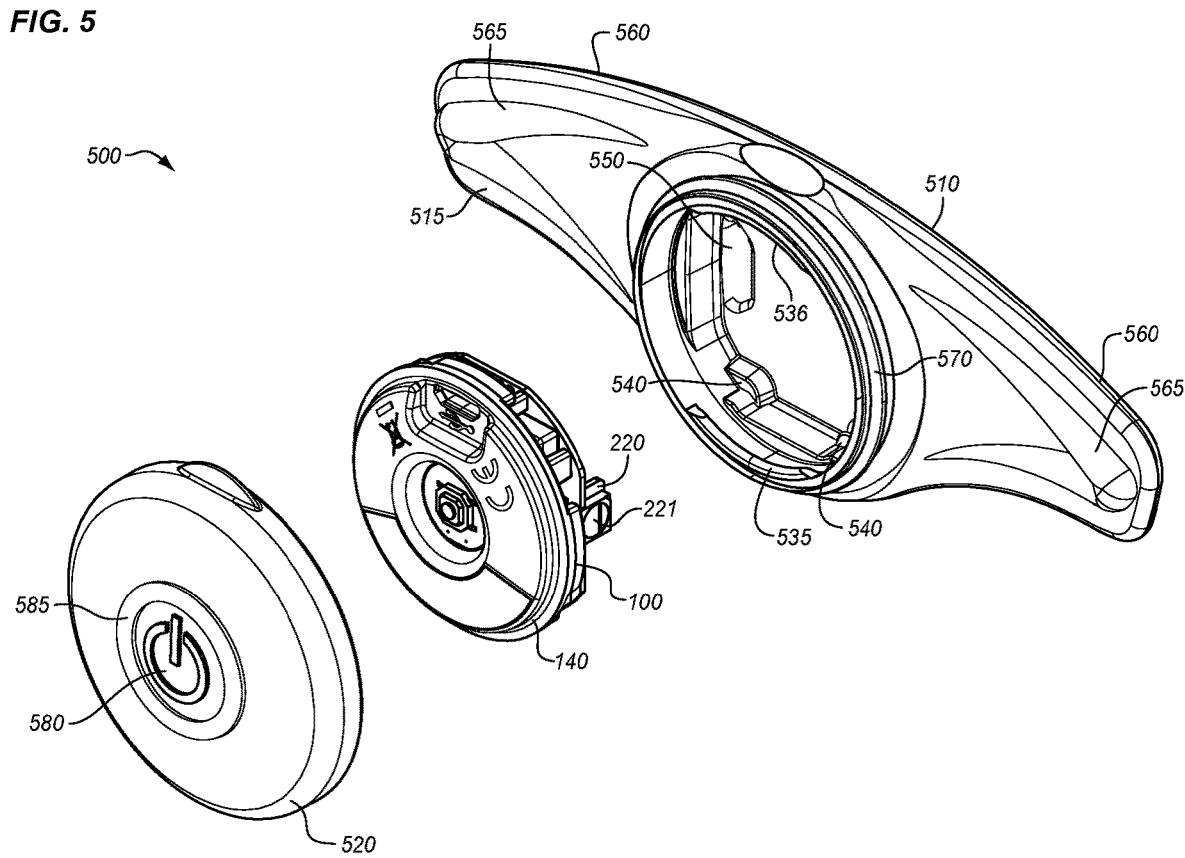
FIG. 5 shows an exploded view of one embodiment of a spoke mounted lighting device.

FIG. 5 shows an exploded view of a spoke mounted lighting device 500 including rechargeable lighting module 100. Spoke mounted lighting device 500 generally includes a body portion 510 and a cap portion 520. Body portion 510 includes a cavity 530 for receiving rechargeable lighting module 100. Cavity 530 includes lips 535, 536. Lips 535, 536 generally interface with lip 140 when rechargeable lighting module 100 is inserted into cavity 530 and prevent rechargeable lighting module 100 from being easily removed or falling out. Additionally, cavity 530 includes four supports 540 (two of which are visible) for the rechargeable lighting module 100. These supports 540 prevent the circuitry from being crushed into the body portion. Additionally, the cavity includes two smaller cavities 550 (one is visible) for receiving perpendicular circuit boards 220 and LEDs 221. In this way the LEDs 221 are effectively surrounded by the material of the body portion.

Figure 6:
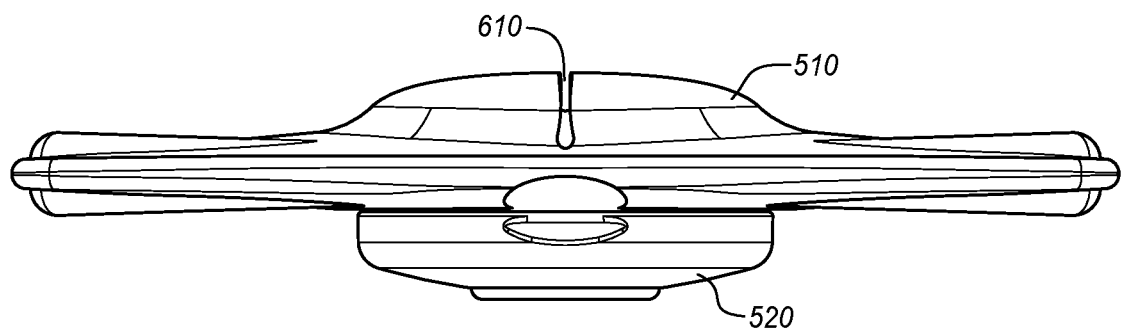
FIG. 6 shows a rear view of the spoke mounted lighting device of FIG. 5.

Body portion 510 includes two arm portions 560 having bumpers 565 for providing pressure when placed against the spokes of a bike or other wheel having spokes. These arm portions 560 work in combination with the spoke groove 610 shown in FIG. 6.

Cap 520 fits onto body portion 510. In many configurations, this is in a waterproof fashion. A lip 570 interfaces with a slot in the underside of cap 520. Cap 520 also includes an on/off button area 580 including a raised circle 585. This is unique because raised circle 585 prevents the inadvertent actuation of the button area 580 by the device being pressed into a surface. Only forces directly on the button area 580 will actuate the button/switch 110.

Figure 7:
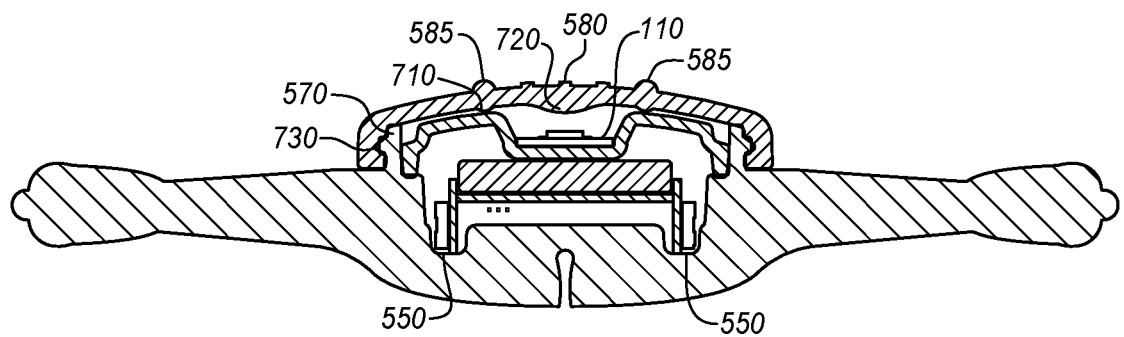
FIG. 7 is a cross section of spoke mounted lighting device of FIG. 5.

FIG. 7 shows this configuration in more detail. FIG. 7 is a cross section of spoke mounted lighting device 500. As is visible, raised circle 585 lines up with raised portion 710 of module frame 120. Therefore, force on raised circle 585 or areas other than button area 580 will not actuate the device. In contrast, force on button portion 580 will cause the device to flex and move protrusion 720 into contact with button/ switch 110. Also visible in this view are lip 570 and slot 730 in the underside of cap 520. Also visible in this view are cavities 550 for receiving perpendicular circuit boards 220 and LEDs 221. This arrangement puts perpendicular circuit boards 220 and LEDs 221 in line with the arms 560 of the device. In this way, since the light projection from the LEDs 221 is in line with the arms, the arms receive a greater portion of the light emitted and function as a light tube to some extent. Since the material of spoke mounted lighting device 500 is typically translucent, some light scattering occurs, causing the device to have an appearance of glowing, especially along the arms of the device. In this way, the LEDs project light along a major axis of the device.

Figure 8:
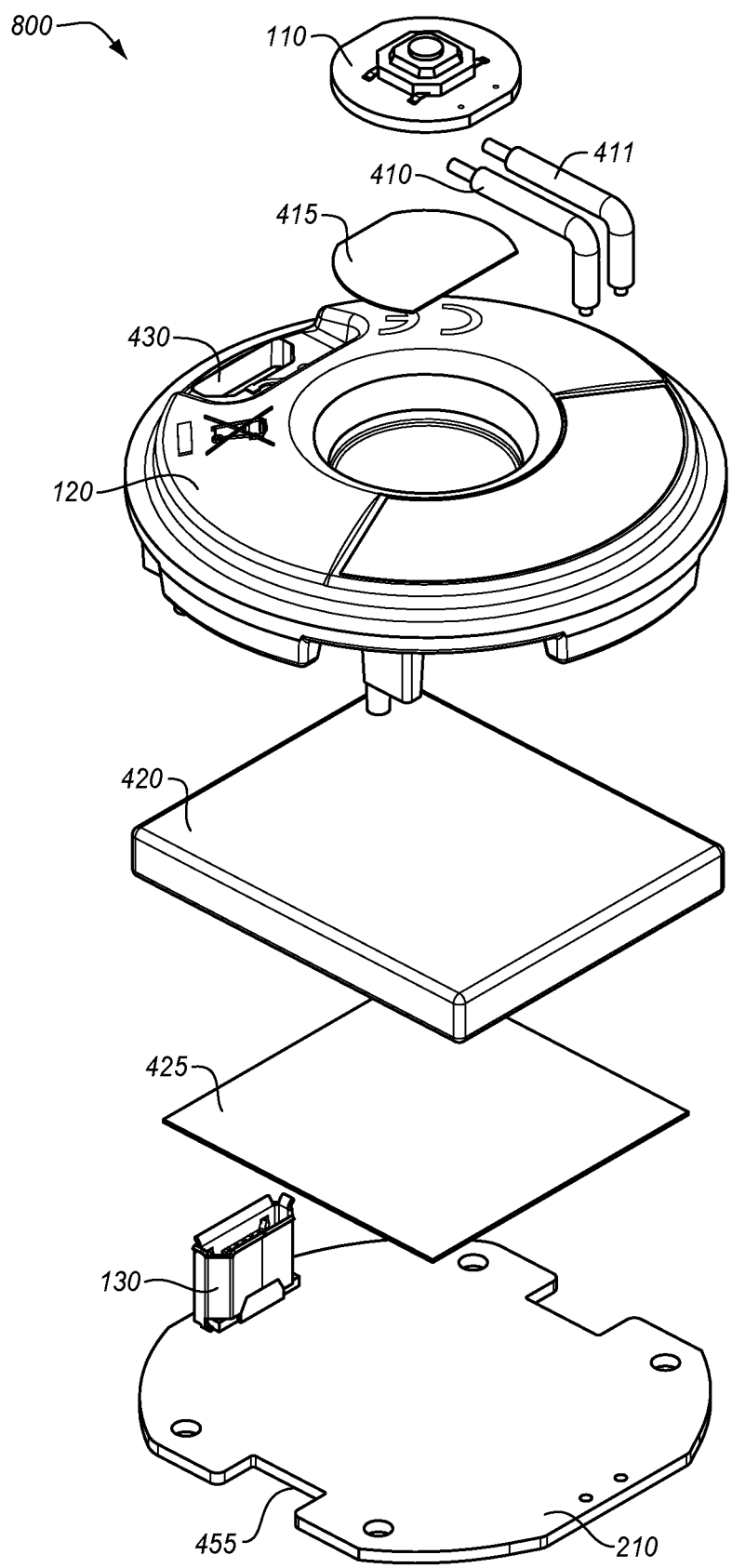
FIG. 8 shows an exploded view of an alternative embodiment of a rechargeable lighting module.

FIG. 8 shows an exploded view of an alternative embodiment of a rechargeable lighting module 800. In rechargeable lighting module 800 the perpendicular circuit boards 220 and LEDs 221 have been replaced in favor of an LED centrally mounted on the circuit board 210. Similar to the previous module, switch 110 is visible as well as wires 410, 411 that provide for connection of the switch to the circuit board 210. Typically, an adhesive 415 is provided to attach switch 110 to module frame 120. This adhesive may be in the form of tape. Battery 420 is show in this figure as is charging port 130. Typically, an adhesive 425 is provided to attach battery 420 to circuit board 210. This adhesive may be in the form of tape. Modular frame 120 includes an aperture 430 for charging port 130. In this view, circuit board 220 is shown interfaced with circuit board 210. In the embodiment shown, aperture 455 in circuit board 210 is shown open.

Figure 9:
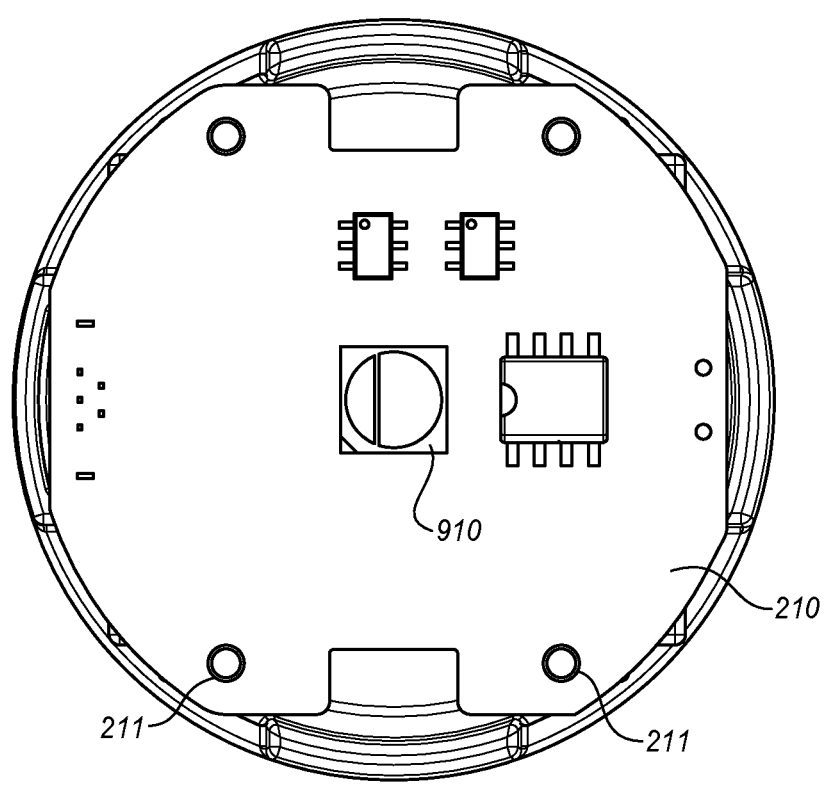
FIG. 9 shows a bottom view of the rechargeable lighting module of FIG. 8.

FIG. 9 shows a bottom view of the rechargeable lighting module 800. In this view, LED 910 is visible mounted on circuit board 210.

Figure 10:
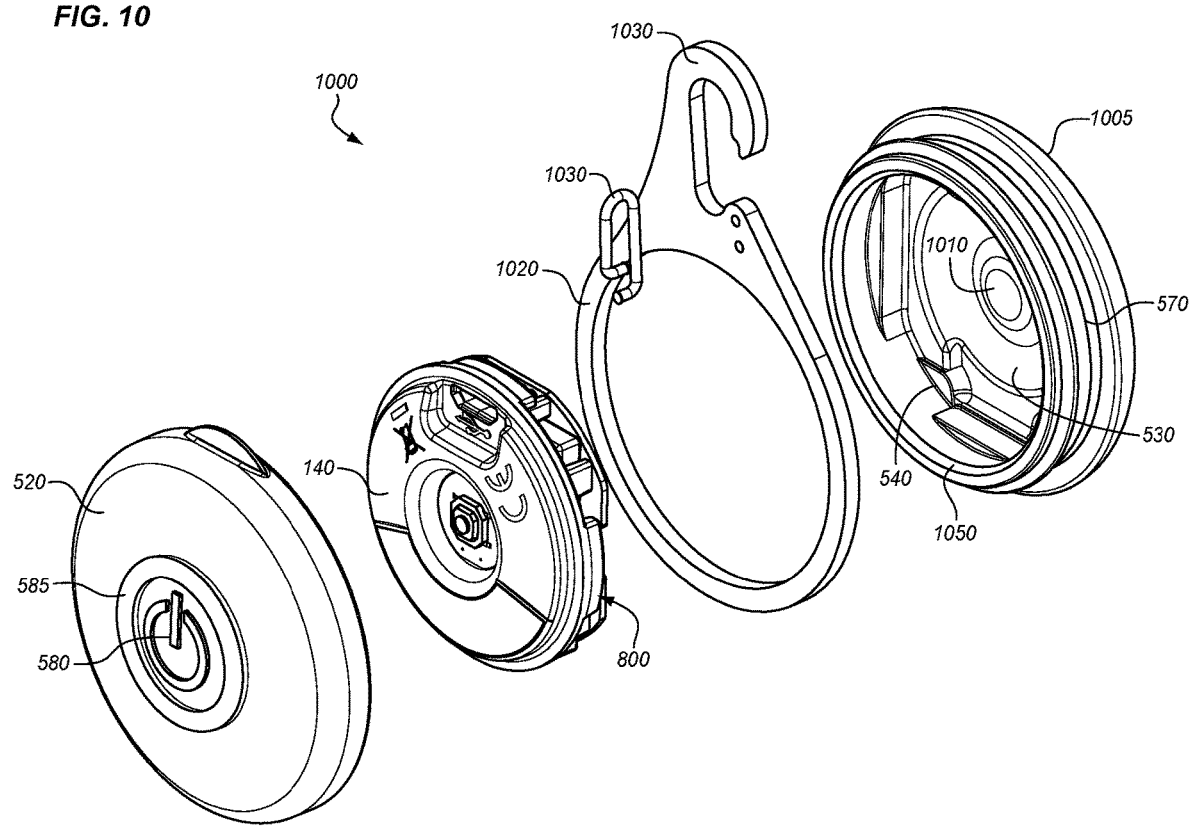
FIG. 10 shows an exploded view of an embodiment of a personal lighting device.

FIG. 10 shows an exploded view of a personal lighting device 1000 including rechargeable lighting module 800. Personal lighting device 1000 includes a similar body portion 1005 having a cavity for receiving the rechargeable lighting module 800. Additionally, cavity 530 includes four supports 540 (two of which are visible) for the rechargeable lighting module 100. The body portion 1005 includes a protrusion 1010, that brings the material of the device into proximity with LED 910 when the device is assembled, such that light from the LED is transmitted directly into the material of body portion 1005, resulting in a lower level of light loss.

Additionally, the personal lighting device 1000 includes a snap hook or carabiner attachment 1020. Carabiner attachment 1020 comes in the form of a ring having a hook/carabiner end 1030. A gate 1035 interfaces with hook/carabiner end 1030 to create a working carabiner gate. Carabiner attachment 1020 is mounted around the body portion 1005 and secured by passing over ridge 570. Ridge 570 also serves to interface with the cap 520 to enclose the rechargeable lighting module 800. As in the previous embodiment, ridge 1050 holds module 800 in place after it has been inserted into cavity 530, being held by edge 140. Additionally, cap 520 also includes ring 585 and button area 580.

Figure 11:
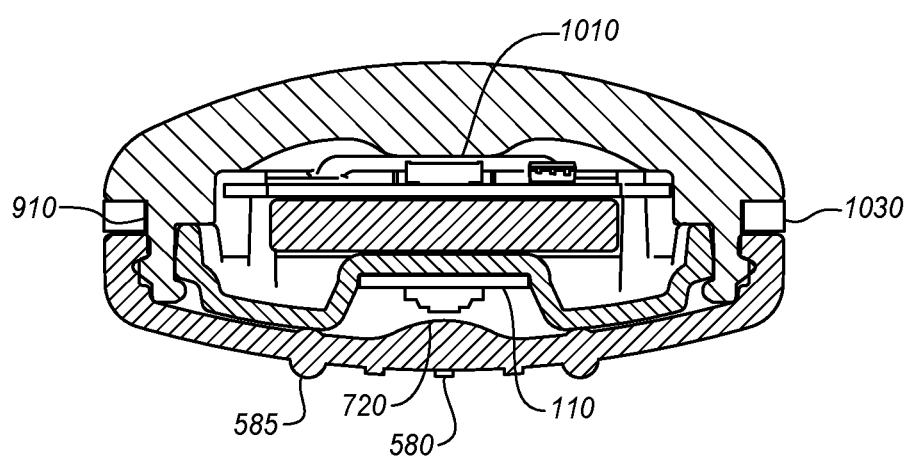
FIG. 11 shows a cross-section of the personal lighting device of FIG. 10.
Figure 12:
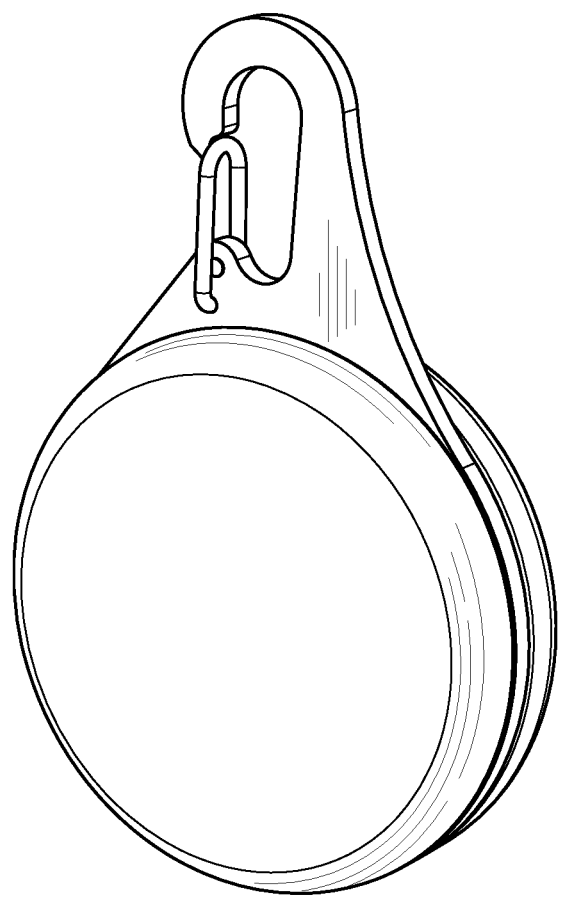
FIGS. 12-19 show additional views of the personal lighting device of FIG. 10.
Figure 13:
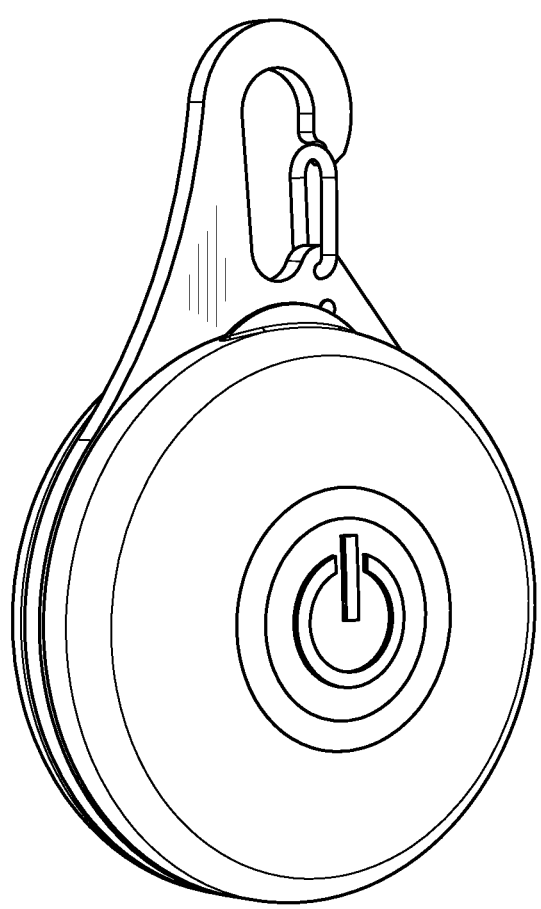
Figure 14:
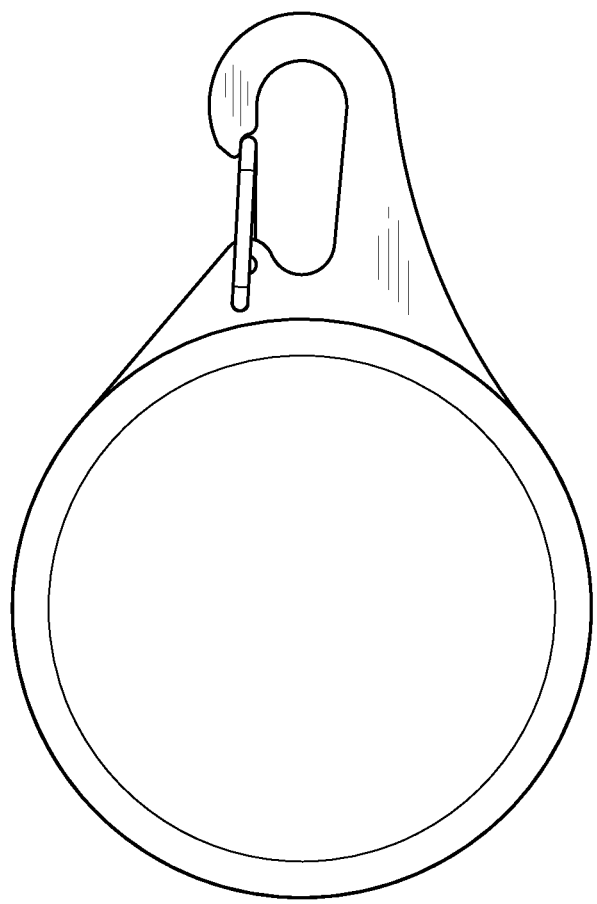
Figure 15:
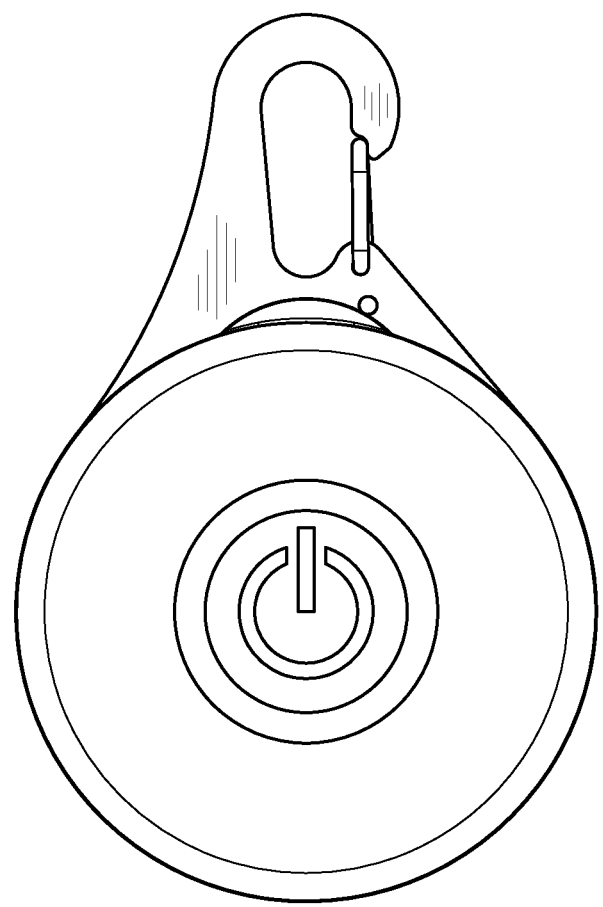
Figure 16:
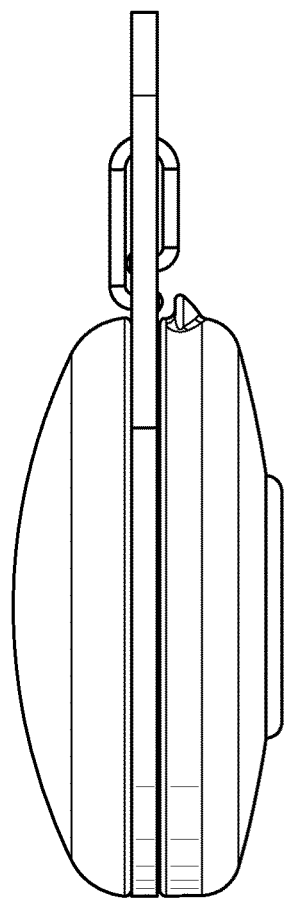
Figure 17:
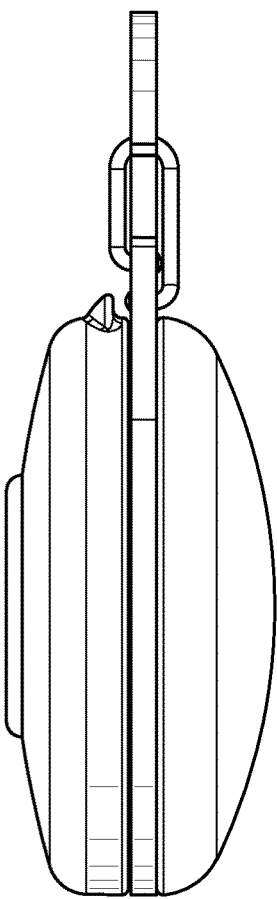
Figure 18:
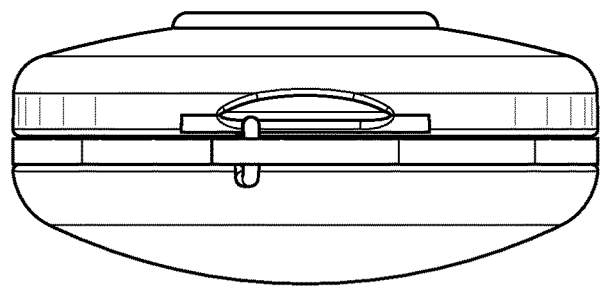
Figure 19:
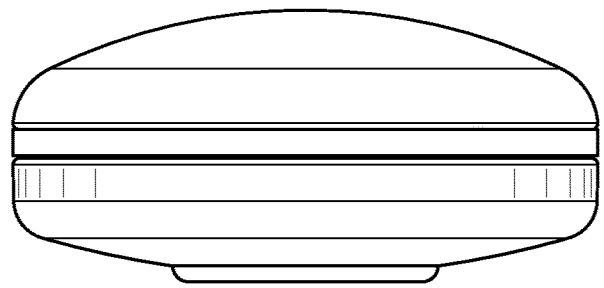
Figure 20:
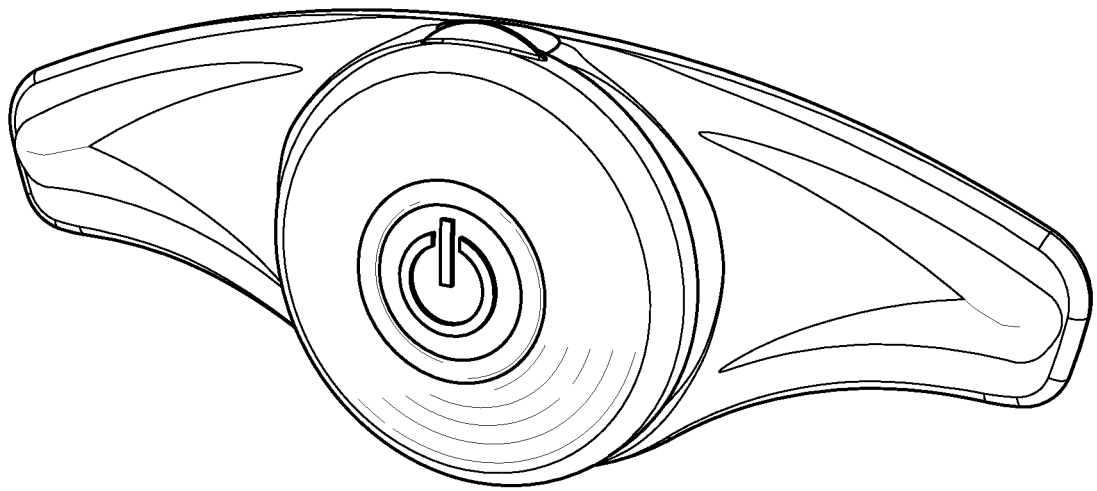
Figure 21:
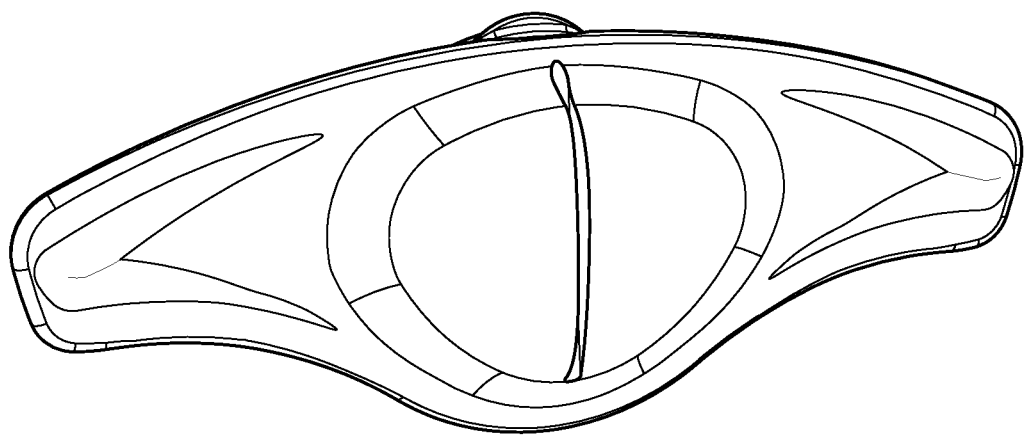
Figure 22:
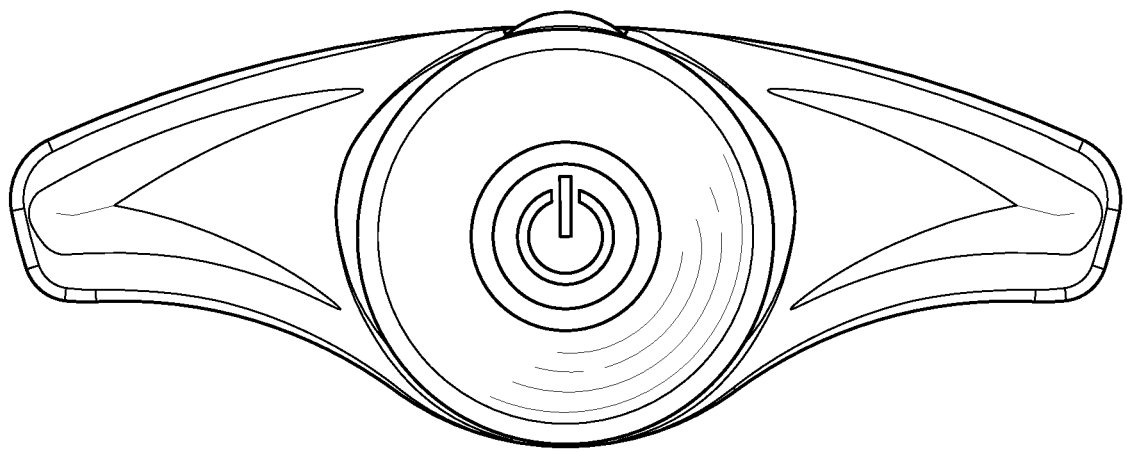
Figure 23:
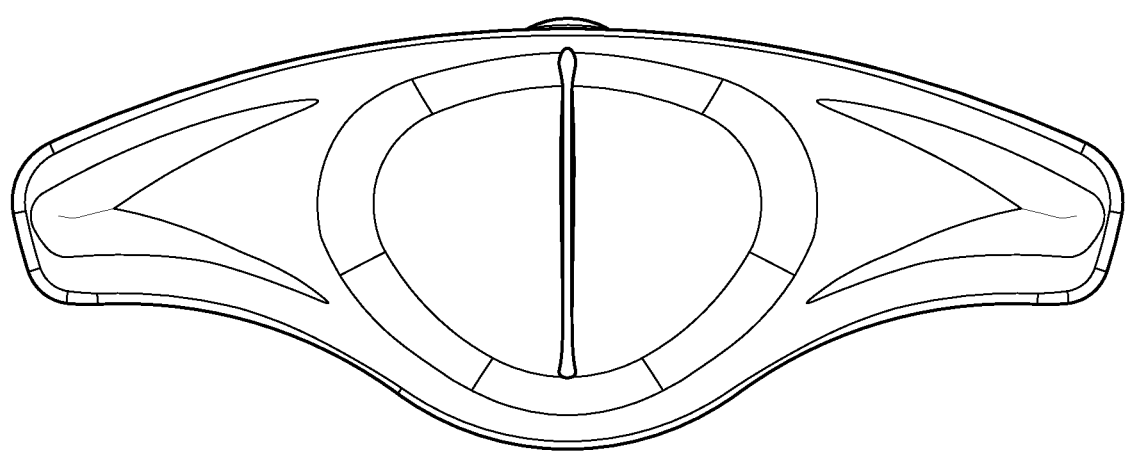

FIG. 11 shows a cross-section of personal lighting device 1000. Visible is the interface between LED 910 and protrusion 1010. As is visible, protrusion 1010 is in contact with or in close proximity, to LED 910. As visible, protrusion 710 interfaces with button/switch 110.

FIGS. 12-19 show additional views of personal lighting device 1000. FIGS. 20-27 show additional views of spoke mounted lighting device 500. Although two particular devices are shown, the lighting module is designed to fit into any device. Generally, the device will have a cavity and an enclosure. Generally, the device will have a flexible area that allows for the switch/button to be actuated. Generally, the enclosure will be openable so that a charging port may be accessed in the lighting module. Generally, the cavity will have a lip or rib that will prevent the lighting module from being removed. Generally, the lighting module will have a shell or frame that will protect the device when the cavity is opened.

In many embodiments, a lighting module and device combination is provided. The lighting module is a complete piece that fits into a molded device of plastic, TPE, silicon, or other material. The molded device is generally translucent so that it will partial transmit light and partially glow by scattering light, such that the device may be lit-up. The molded device is generally a two-piece device that includes a body portion with a cavity and a cap that closes the cavity. In many configurations, the molded device is shaped internally in the cavity, such that the body portion contacts or comes in very close proximity to the LED. In many configurations, the LED is oriented such that it projects light along a major axis of the device. In many embodiments, the lighting module includes a rechargeable battery. In many embodiments, the lighting module includes a port for charging the battery. In many embodiments, the port may only be accessed when the cap is removed. In many embodiments, the lighting module includes a circuit board and a frame portion that is connected to the circuit board. In many configurations, the lighting module includes a switch mounted in a recess in the frame portion. In many configurations, the battery is located between the circuit board and the frame portion. In many embodiments, the cavity includes supports for the lighting module such that the circuit board is not crushed or impacted by the body portion. In many configurations, the cavity includes a lip that interfaces with a portion of the frame to prevent removal of the lighting module after insertion into the cavity. In many configurations, the cap includes a button area that is surrounded by a ring. The ring prevents the actuation of the button area by mistake or by being pressed into a surface. This is because the area under the ring and away from the button area is braced by a surface of the frame. In many embodiments, the molded device includes a connection apparatus for connection to another surface, item, user, or thing.

In many embodiments, parts of the system are provided in devices including microprocessors. For instance, a microprocessor may run and manage the LEDs. Various embodiments of the systems and methods described herein may be implemented fully or partially in software and/or firmware. This software and/or firmware may take the form of instructions contained in or on a non-transitory computer-readable storage medium. Those instructions then may be read and executed by one or more processors to enable performance of the operations described herein. The instructions may be in any suitable form such as, but not limited to, source code, compiled code, interpreted code, executable code, static code, dynamic code, and the like. Such a computer-readable medium may include any tangible non-transitory medium for storing information in a form readable by one or more computers such as, but not limited to, read only memory (ROM); random access memory (RAM); magnetic disk storage media; optical storage media; a flash memory, etc.

While specific embodiments have been described in detail in the foregoing detailed description, it will be appreciated by those skilled in the art that various modifications and alternatives to those details could be developed in light of the overall teachings of the disclosure and the broad inventive concepts thereof. It is understood, therefore, that the scope of this disclosure is not limited to the particular examples and implementations disclosed herein but is intended to cover modifications within the spirit and scope thereof as defined by the appended claims and any and all equivalents thereof.

What is claimed as new and desired to be protected by Letters Patent of the United States is:

1. A lighting module, comprising:
   a module frame comprising opposing first and second sides and a recess disposed in the second side;
   a circuit board mounted to the first side of the module frame;
   a button mounted to the second side of the module frame and interconnected with the circuit board, the button located in the recess of the module frame, such that the button is actuatable by a protrusion of a device into which the lighting module is inserted; and
   a cap formed to fit with the device and comprising a button area and a raised portion surrounding the button area,
   wherein the module frame comprises a ledge configured to interface with a lip of the device to hold the module frame in place and limit a removal of the lighting module from the device, and
   wherein a first underside portion of the cap opposite the raised portion interfaces with a raised portion of the module frame, such that the raised portion of the cap cannot be depressed.

2. The lighting module of claim 1, wherein the module frame and the circuit board sandwich a battery.

3. The lighting module of claim 2, further comprising a charging port, wherein the battery is rechargeable, and the module frame includes an aperture for the charging port.

4. The lighting module of claim 1, further comprising:
   the device, the device comprising a cavity and one or more lips disposed in the cavity, wherein the one or more lips interface with the ledge of the module frame to prevent the removal of the lighting module from the cavity; and
   wherein the cap is formed to seal the lighting module within the cavity.

5. The lighting module of claim 4, wherein the device protects a face of the lighting module, the face being exposed when the lighting module is in the cavity.

6. The lighting module of claim 1, wherein a LED is mounted on the circuit board.

7. The lighting module of claim 6, wherein the LED is mounted normal to the circuit board.

8. A lighting device, comprising:
   a lighting module, including:
      a module frame comprising opposing first and second sides, a ledge, and a first recess disposed in the second side;
      a circuit board mounted to the first side of the module frame; and
      a button mounted to the second side of the module frame and interconnected with the circuit board, the button located in the first recess of the module frame; and
   a device body, the device body including:
      a second recess for receiving the lighting module;
      one or more lips disposed in the second recess and configured to interface with the ledge of the module frame to hold the module frame in place and limit a removal of the lighting module from the second recess; and
      a cap formed to fit with the device body and seal the lighting module within the second recess when the lighting module is in the second recess, the cap including a button area and a raised portion surrounding the button area,
   wherein a first underside portion of the cap opposite the raised portion interfaces with a raised portion of the module frame that surrounds the first recess, such that the raised portion of the cap cannot be depressed.

9. The lighting device of claim 8, wherein the one or more lips comprise a plurality of lips disposed in the second recess and each configured to interface with the ledge of the module frame, preventing the lighting module from being removed from the second recess.

10. The lighting device of claim 9, wherein the lighting module includes an LED and the device body is shaped such that a portion of the device body is in close proximity to the LED.

11. The lighting device of claim 9, wherein the lighting module includes an LED and the device body is shaped such that a portion of the device body is in contact with the LED.

12. The lighting device of claim 9, wherein the device body includes an aperture shaped to receive the LED.

13. The lighting device of claim 9, wherein the device body includes a protrusion that is adjacent to the LED when the lighting module is inserted in the second recess.

14. The lighting device of claim 12, wherein the LED is oriented to project light primarily along a major axis of the device.

15. The lighting device of claim 14, wherein an arm extends from the device body along the major axis of the device.

16. The lighting device of claim 15, wherein the aperture positions the LED to project light primarily into the arm.

17. The lighting device of 8, wherein the raised portion preventing of the cap limits the button from being inadvertently activated.

18. The lighting device of claim 8, wherein a second underside portion opposite the button area interfaces with the button, such that when the button area is depressed the button is pushed.

19. The lighting device of claim 18, wherein the button is a momentary switch.

20. The lighting device of claim 8, wherein the device body includes a carabiner portion.

21. The lighting device of claim 8, wherein the device body includes an aperture for attachment to a spoke and a first and second arm for bracing against a spoke.

22. The lighting device of claim 21, wherein the first and second arm each include a protrusion for bracing against the spoke.

23. A method of using a lighting device, comprising:
   providing a lighting device, comprising:
      a lighting module, including:
         a module frame comprising opposing first and second sides, a ledge, and a first recess disposed in the second side;
         a circuit board mounted to the first side of the module frame; and
         a button mounted to the second side of the module frame and interconnected with the circuit board, the button located in the first recess of the module frame; and
      a device body, the device body including:
         a second recess for receiving the lighting module;
         one or more lips disposed in the second recess and configured to interface with the ledge of the module frame to hold the module frame in place and limit a removal of the lighting module from the second recess; and a cap formed to fit with the device body and seal the lighting module within the second recess when the lighting module is in the second recess, the cap including a button area and a raised portion surrounding the button area, wherein a first underside portion of the cap opposite the raised portion interfaces with a raised portion of the module frame that surrounds the first recess, such that the raised portion of the cap cannot be depressed;

pressing on the raised portion of the button;
not activating the lighting device;
pressing on the button area; and
activating the lighting device.

24. The lighting module of claim 4, wherein the device comprises a protrusion that is adjacent to an LED of the circuit board when the lighting module is inserted into the cavity.

* * * * *